US009286987B1

(12) United States Patent
Dong et al.

(10) Patent No.: US 9,286,987 B1
(45) Date of Patent: Mar. 15, 2016

(54) CONTROLLING PASS VOLTAGES TO MINIMIZE PROGRAM DISTURB IN CHARGE-TRAPPING MEMORY

(71) Applicant: SanDisk Technologies Inc., Plano, TX (US)

(72) Inventors: Yingda Dong, San Jose, CA (US); Hong-Yan Chen, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/481,304

(22) Filed: Sep. 9, 2014

(51) Int. Cl.
*G11C 11/34* (2006.01)
*G11C 16/10* (2006.01)
*G11C 16/04* (2006.01)
*G11C 16/34* (2006.01)

(52) U.S. Cl.
CPC ............ *G11C 16/10* (2013.01); *G11C 16/0466* (2013.01); *G11C 16/3459* (2013.01)

(58) Field of Classification Search
CPC . G11C 16/10; G11C 16/0466; G11C 16/3459
USPC .............. 365/185.17, 185.18, 185.19, 185.22
See application file for complete search history.

(56) References Cited

U.S. PATENT DOCUMENTS

| 6,859,397 | B2 * | 2/2005 | Lutze | G11C 16/3418 365/185.17 |
|---|---|---|---|---|
| 7,355,889 | B2 | 4/2008 | Hemink et al. | |
| 7,545,680 | B2 * | 6/2009 | Kim | G11C 8/08 365/185.17 |
| 7,561,469 | B2 * | 7/2009 | Aritome | G11C 11/5628 365/185.02 |
| 7,616,506 | B2 * | 11/2009 | Mui | G11C 7/1006 365/185.17 |
| 7,864,570 | B2 * | 1/2011 | Oowada | G11C 16/0483 365/185.02 |
| 7,898,861 | B2 * | 3/2011 | Aritome | G11C 16/3418 365/185.17 |
| 7,944,752 | B2 * | 5/2011 | Lee | G11C 16/0483 365/185.02 |
| 8,004,889 | B2 * | 8/2011 | Shibata | G11C 11/5628 365/185.03 |
| 8,051,240 | B2 | 11/2011 | Dutta et al. | |
| 8,295,097 | B2 * | 10/2012 | Cho | G11C 16/0483 365/185.18 |
| 8,325,520 | B2 | 12/2012 | Aritome | |
| 8,385,131 | B2 * | 2/2013 | Seol | G11C 16/0483 365/185.11 |
| 8,599,620 | B2 * | 12/2013 | Nawata | G11C 16/10 365/185.17 |
| 8,605,507 | B2 * | 12/2013 | Liu | G11C 16/10 365/185.17 |
| 8,687,429 | B2 * | 4/2014 | Aritome | G11C 16/10 365/185.18 |
| 8,699,271 | B2 * | 4/2014 | Maejima | G11C 16/10 365/185.02 |

(Continued)

OTHER PUBLICATIONS

International Search Report & the Written Opinion of the International Searching Authority dated Nov. 16, 2015, International Application No. PCT/US2015/046679.

*Primary Examiner* — Viet Q Nguyen
(74) *Attorney, Agent, or Firm* — Vierra Magen Marcus LLP

(57) ABSTRACT

Techniques are provided for preventing program disturb of unselected memory cells during programming of a selected memory cell in a NAND string which includes a continuous charge-trapping layer, either in a two-dimensional or three-dimensional configuration. In such a NAND string, regions between the memory cells can be inadvertently programmed as parasitic cells due to the program voltage and pass voltages on the word lines. For programmed cells, an upshift in threshold voltage due to a parasitic cell can be avoided by providing a higher pass voltage on an adjacent later-programmed word line than on an adjacent previously-programmed word line. For erased cells, an upshift in threshold voltage due to the parasitic cells can be reduced by progressively lowering the pass voltage on the adjacent later-programmed word line. The lowering can occur when memory cells of a lowest target data state complete programming.

13 Claims, 13 Drawing Sheets

(56) References Cited

U.S. PATENT DOCUMENTS

| | | | |
|---|---|---|---|
| 8,854,891 B2* | 10/2014 | Aritome | G11C 16/10 365/185.18 |
| 8,982,637 B1* | 3/2015 | Dong | G11C 16/26 365/185.18 |
| 9,030,879 B2* | 5/2015 | Rhie | G11C 16/0483 365/185.01 |
| 9,208,887 B2* | 12/2015 | Kondo | G11C 16/10 |
| 9,230,663 B1* | 1/2016 | Lu | G11C 16/10 |
| 2008/0013374 A1* | 1/2008 | Li | G11C 11/5628 365/185.03 |
| 2011/0032757 A1 | 2/2011 | Dutta et al. | |
| 2013/0058166 A1 | 3/2013 | Maejima | |
| 2015/0262678 A1* | 9/2015 | Kim | G11C 16/10 365/185.18 |

\* cited by examiner

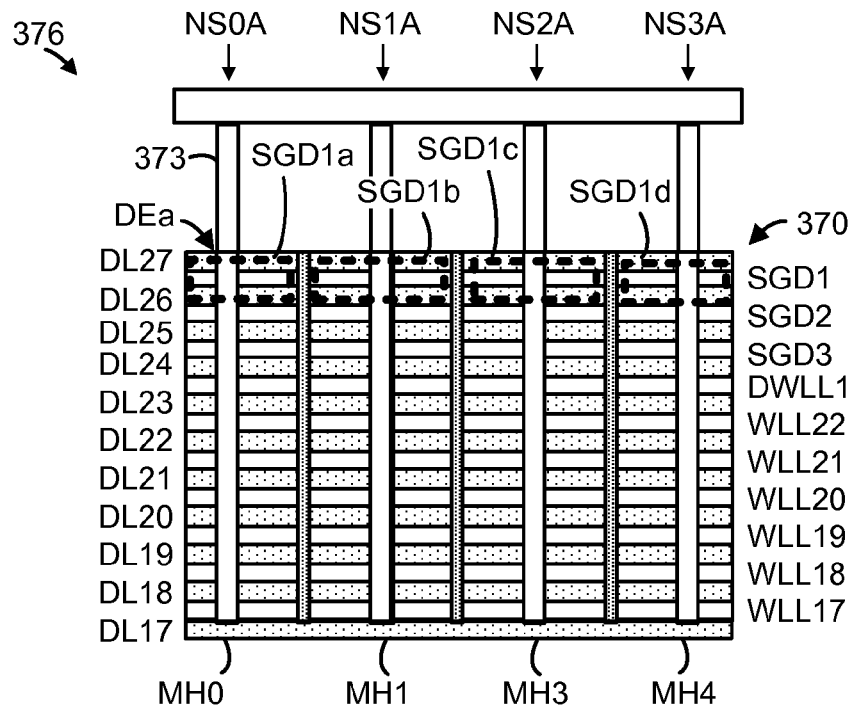
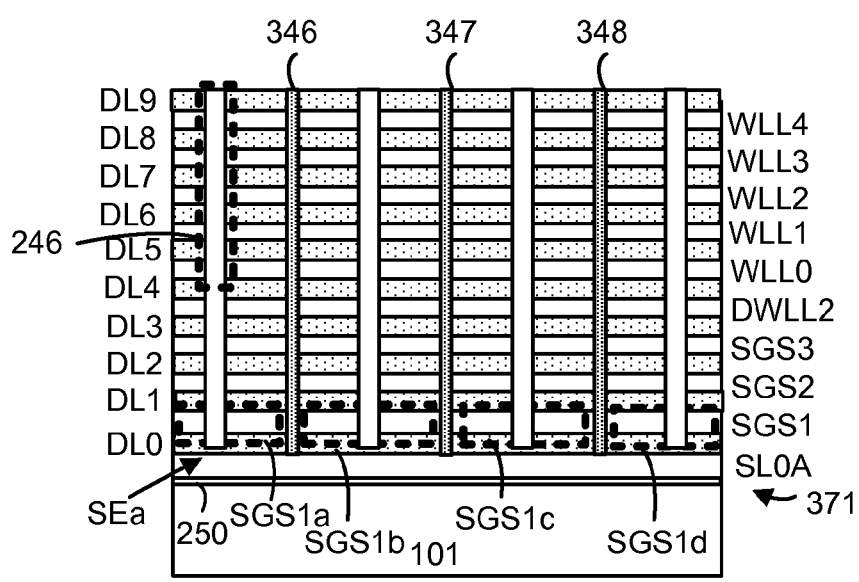
Fig. 3C

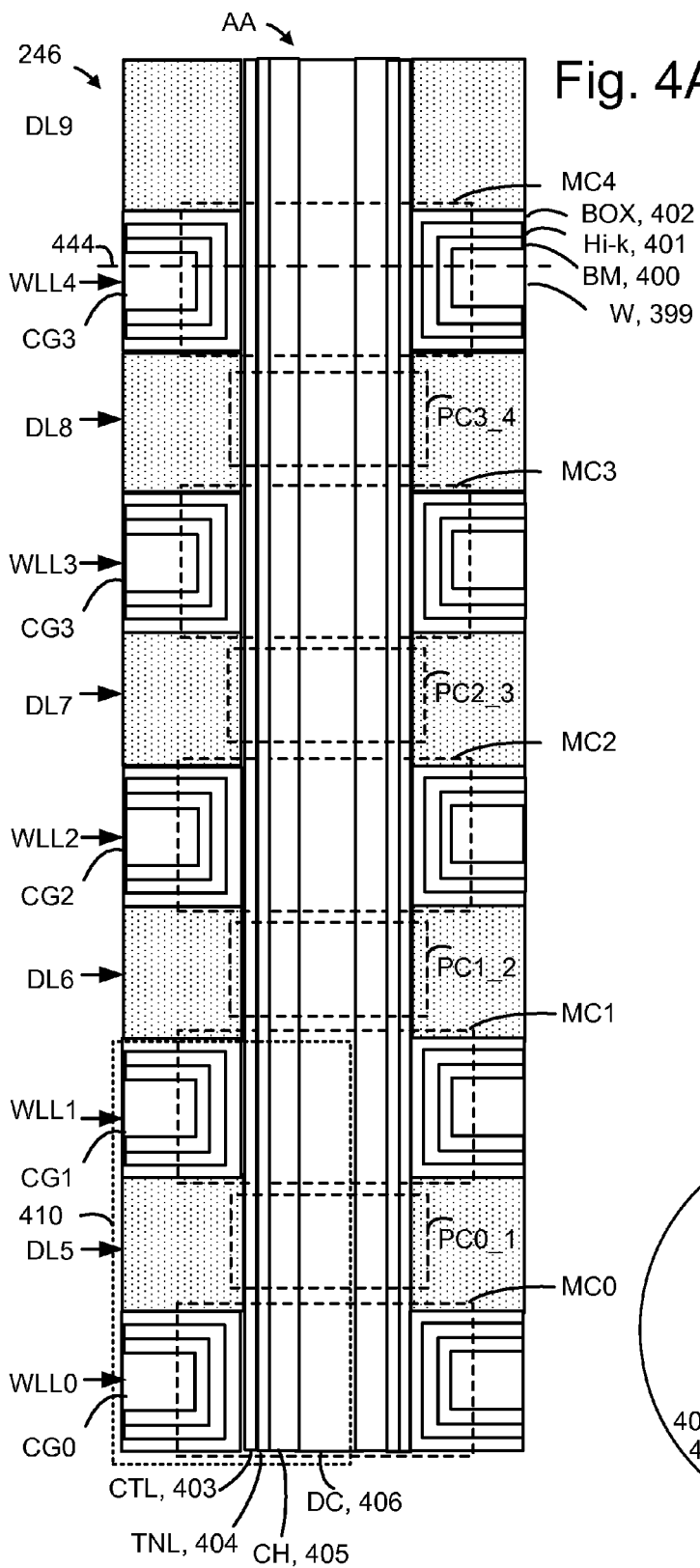
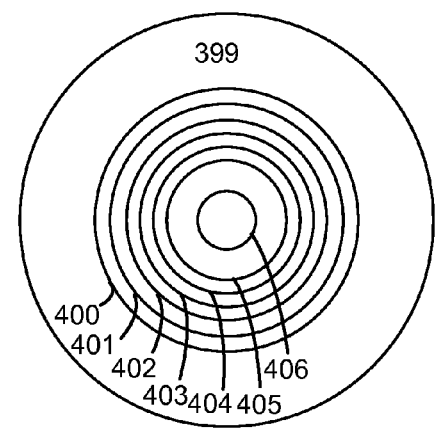

| 1st time | | | 2nd time | | |
|---|---|---|---|---|---|
| Vpgm(MC0) | Vpass(MC1) | Efield | Vpass(MC0) | Vpgm(MC1) | Efield |
| 21 (A state) | 9 | 30 | 7 | 21 (A state) | 28 |
| | | | | 22 (B state) | 29 |
| | | | | 23 (C state) | 30 |
| 22 (B state) | 8 | 30 | 7 | 21 (A state) | 28 |
| | | | | 22 (B state) | 29 |
| | | | | 23 (C state) | 30 |
| 23 (C state) | 7 | 30 | 7 | 21 (A state) | 28 |
| | | | | 22 (B state) | 29 |
| | | | | 23 (C state) | 30 |

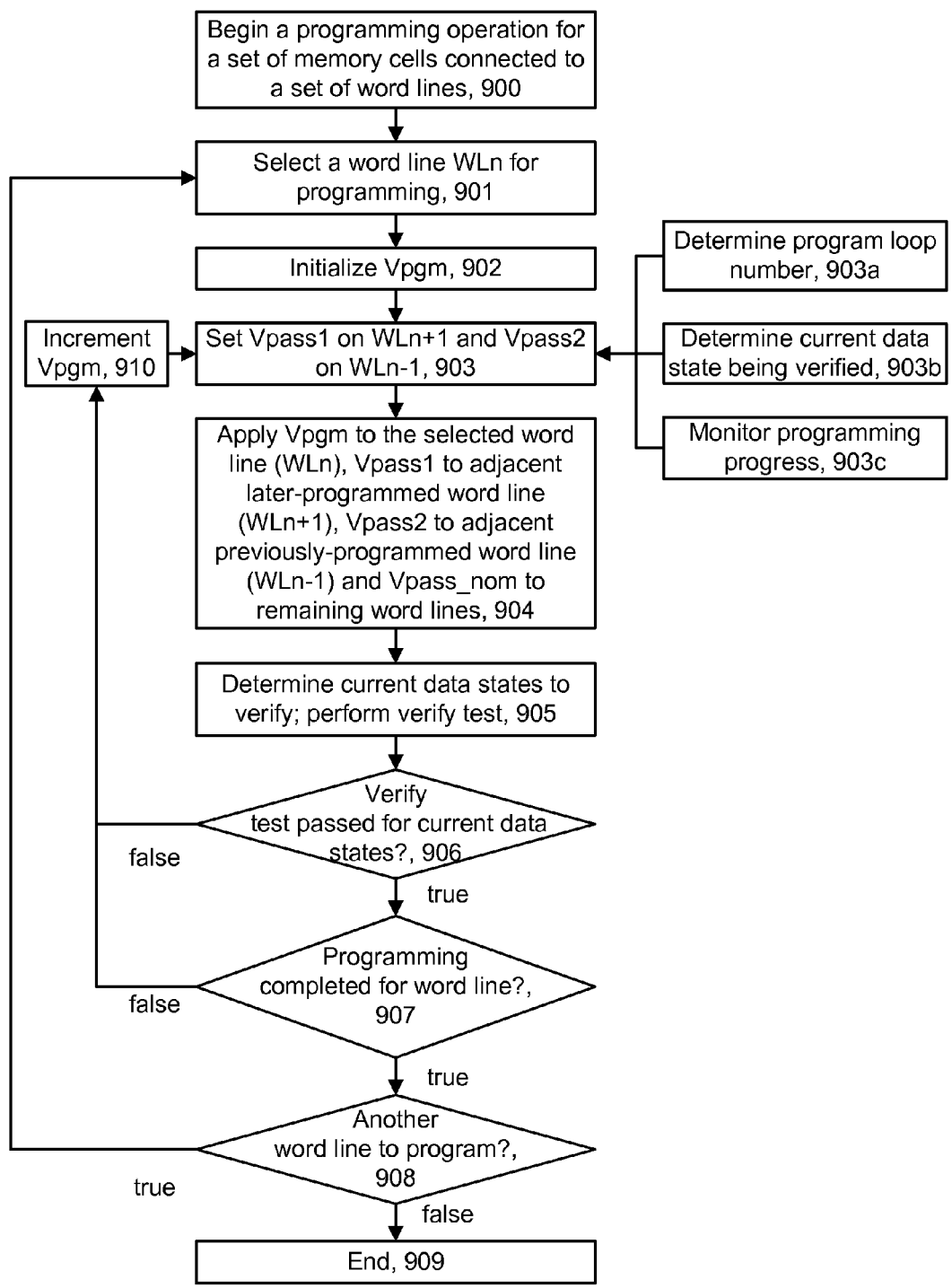

US 9,286,987 B1

CONTROLLING PASS VOLTAGES TO MINIMIZE PROGRAM DISTURB IN CHARGE-TRAPPING MEMORY

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 3C depicts an embodiment of a stack 376 showing a cross-sectional view of the portion 307 of FIG. 3A, along line 305.

FIG. 4A depicts a view of the region 246 of FIG. 3C, showing memory cells MC1 to MC5.

FIG. 4B depicts a cross-section view of the region 246 of FIG. 4A along line 444.

FIG. 9 depicts an example programming operation for memory cells which minimizes program disturb by optimizing pass voltages.

DETAILED DESCRIPTION

Figure 1A:
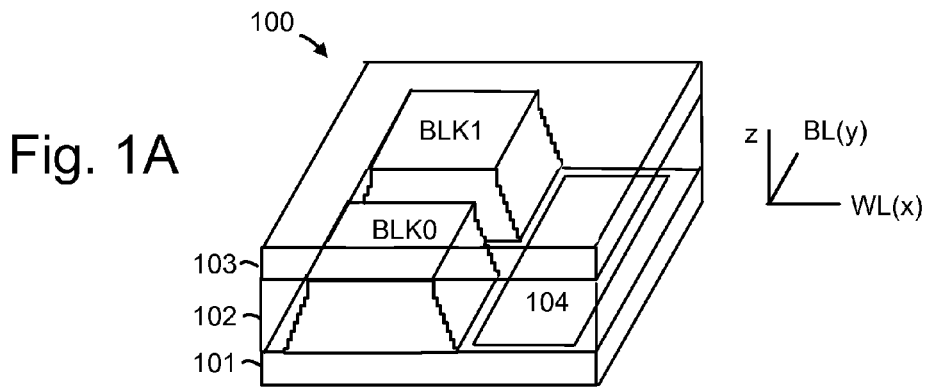
FIG. 1A is a perspective view of a 3D stacked non-volatile memory device.

Techniques are provided for reducing program disturb during a programming operation involving memory cells which are formed along a continuous charge-trapping region.

In a charge-trapping memory device, a continuous charge-trapping region may extend throughout a NAND string, for instance, where different portions of the charge-trapping region are associated with different respective memory cells which are connected to different respective word lines. Each memory cell has a control gate which receives a program voltage (Vpgm) via respective word line when it is programmed. For each programmed memory cell, the program voltage causes charges (electrons) to move from a channel region to a respective portion of the charge-trapping region, where the charges are stored to represent a programmed data state of the memory cell. Some cells are not programmed and remain in an erased state. While a selected memory cell receives the program voltage, other, unselected memory cells receive a pass voltage which is high enough to provide the unselected memory cells in a conductive state but not high enough to program them. Moreover, typically the memory cells are programmed in a word line programming order, one word line at a time, starting at one end of a NAND string and continuing to the other end of the NAND string.

However, during a program operation, portions of the charge-trapping region which are between the memory cells can be inadvertently programmed. In particular, the highest program voltage on a word line and the pass voltage on an adjacent word line work in combination to produce a fringing electric field which can draw electrons into a portion of the charge-trapping region which is between the word lines. The highest program voltages are used to complete the programming of the highest data states, e.g., the C state in a four level memory device comprising Er, A, B and C states, or the F and G states in an eight level memory device comprising Er, A, B, C, D, E, F and G states.

This portion of the charge-trapping region which is between the word lines acts as a parasitic cell. When the memory cells are subsequently read, they may experience an upshift in their threshold voltage due to the parasitic cells. The memory cells in the erased state and the lowest programmed state are subject to the largest Vth upshift. Moreover, this problem is seen especially in memory devices which are scaled down such that the distance between word lines is less than about 25 nm, and becomes worse as the distance decreases.

Techniques provided herein address the above-mentioned issues. The techniques involve optimizing the pass voltages during a programming operation so that, when a selected nth word line (WLn) is programmed, the pass voltage is higher on a later-programmed word line (e.g., WLn+1) than a previously-programmed word line (e.g., WLn−1) during an initial part of the programming operation. Subsequently, the pass voltage on WLn+1 can be gradually lowered. This approach notes that a parasitic cell is subject to a fringing field in two situations. For example, consider a parasitic cell (e.g., PC0_1 in FIG. 4C) which is between a memory cell MC0 on a word line WLL0 and a memory cell MC1 on a word line WLL1.

In a first situation, when MC0 is completing programming, MC0 receives a final Vpgm, Vpgm(MC0), and MC1 receives a pass voltage, Vpass1. PC0_1 therefore will have a Vth which is a function of Vpgm(MC0)+Vpass1. In a second situation, when MC1 is completing programming, MC1 receives a final Vpgm, Vpgm(MC1), and MC0 receives a pass voltage Vpass2. PC0_1 will have a Vth which is a function of Vpgm(MC1)+Vpass2, if Vpgm(MC1)+Vpass2>Vpgm(MC0)+Vpass1. This is true because the parasitic cell is not programmed further unless it is exposed to a stronger fringing field than what it has previously experienced.

To avoid further programming of PC0_1 when MC1 is programmed, we have: Vpass1−Vpass2>=Vpgm(MC1)−Vpgm(MC0). Thus, a difference between the pass voltages can be set based on a highest possible difference between the highest final Vpgm on the two memory cells. This difference typically correlates to the difference between the verify levels of the highest and lowest programmed data states. Further, Vpass should not be too high or it can begin to program a memory cell and Vpass should not be too low or it will provide an inadequate channel boosting potential.

When a given memory cell is read, its Vth is affected by the parasitic cell which is after the given memory cell in the programming order, because this parasitic cell may be further programmed after the given memory cell is programmed. In contrast, the parasitic cell which is before the given memory cell in the programming order generally does not affect the Vth of the given memory cell when it is read because any effect of this parasitic cell can be compensated for in the programming of the given memory cell. However, if the given memory cell is in the erased state, its Vth is affected by the parasitic cells which are before and after the given memory cell in the programming order. To minimize the programming of the parasitic cells adjacent to an erased state cell, Vpass1 can be lowered as the programming operation proceeds, so that it is at its lowest point when the highest Vpgm is applied. Specifically, Vpass1 can step down so that on or before the final program pulse of the programming operation, it reaches a minimum level which is the same as, or slightly higher than (e.g., up to 1 V higher) Vpass2. That is, Vpass1 is no lower than the second pass voltage during a final program voltage of the program voltages. Vpass2 can remain at a fixed level throughout the programming operation, in one approach.

Providing Vpass1>Vpass2 initially, and lowering Vpass1 (and the difference dVpass=Vpass1−Vpass2) as the programming operation proceeds, optimally reduces the widening of the erased state cells and the programmed state cells.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
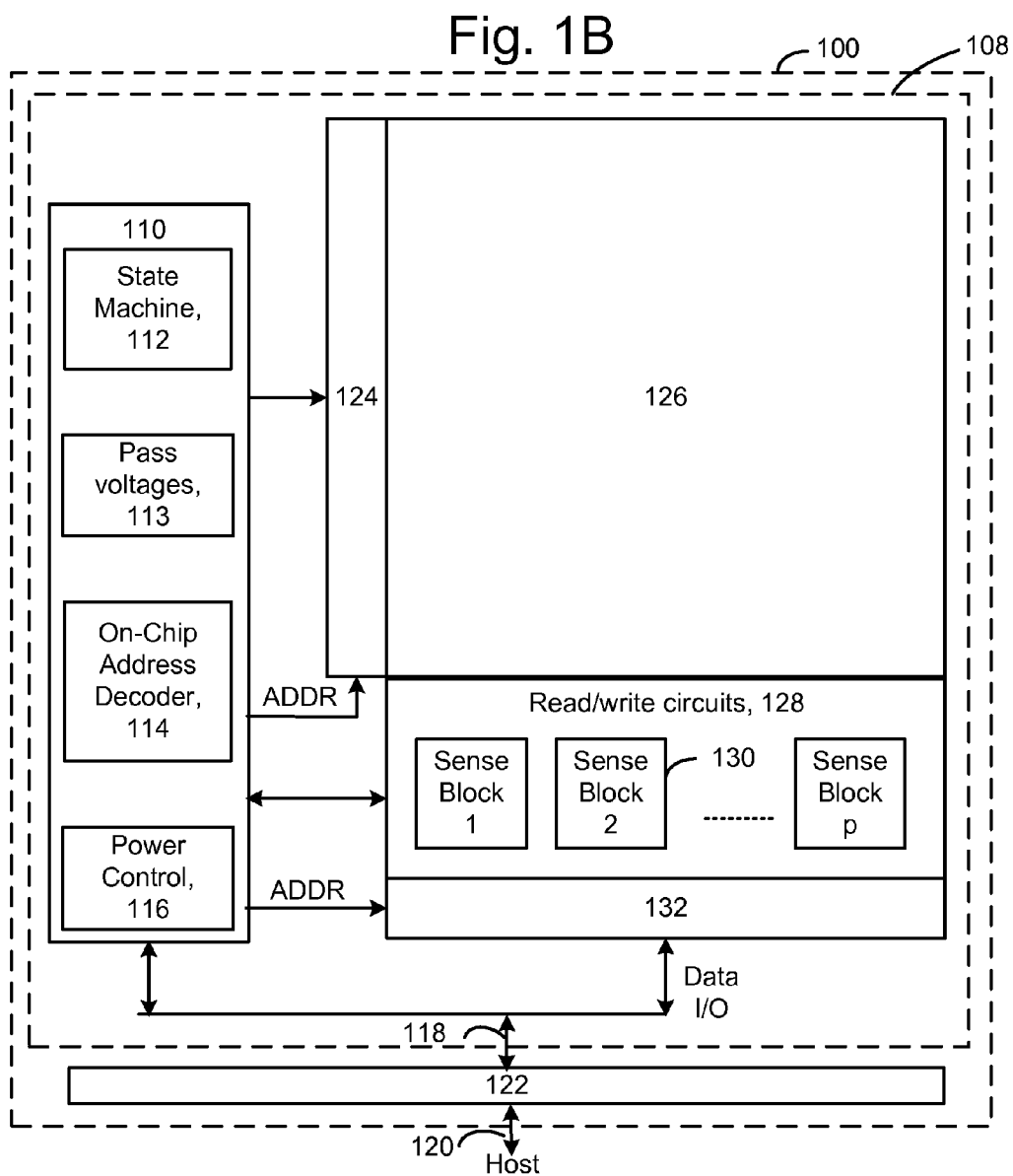
FIG. 1B is a functional block diagram of a memory device such as the 3D stacked non-volatile memory device 100 of FIG. 1A or a 2D memory device such as depicted in FIG. 5A to 5C.
Figure 5A:
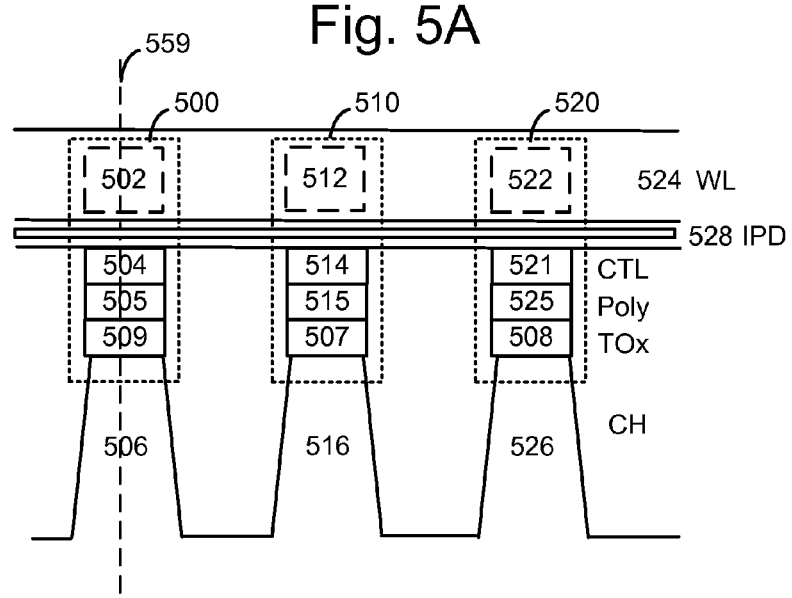
FIG. 5A depicts a cross-sectional view in a word line direction of memory cells comprising a flat control gate and charge-trapping regions as a 2D example of memory cells in the memory structure 126 of FIG. 1B.
Figure 5B:
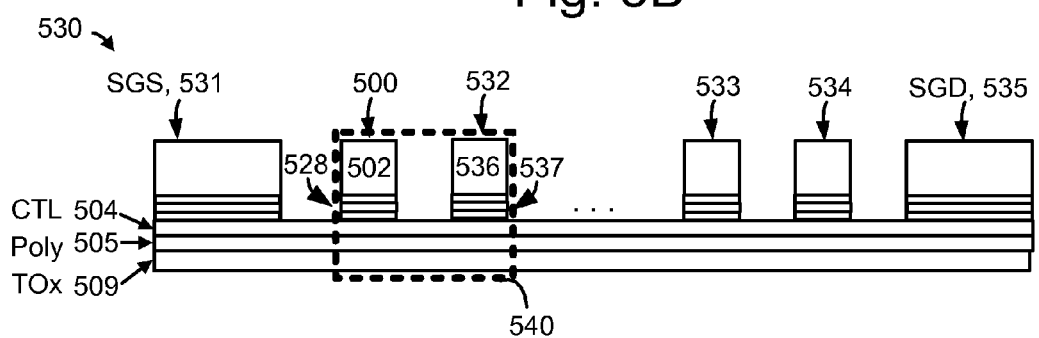
FIG. 5B depicts a cross sectional view along line 559 in FIG. 5A, showing a NAND string 530 having a flat control gate and a charge-trapping layer.
Figure 5C:
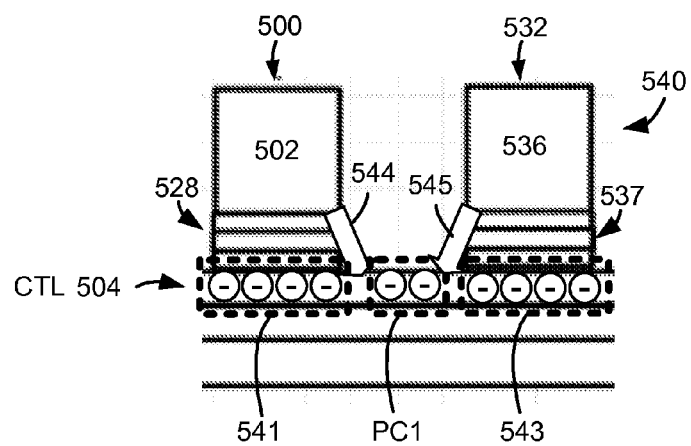
FIG. 5C depicts an expanded view of a portion 540 of the NAND string of FIG. 5B, showing the formation of a parasitic cell PC1.

FIG. 1B is a functional block diagram of a memory device such as the 3D stacked non-volatile memory device 100 of FIG. 1A or a 2D memory device such as depicted in FIG. 5A to 5C. The memory device 100 may include one or more memory die 108. The memory die 108 includes a memory structure 126 of memory cells, such as an array of cells, control circuitry 110, and read/write circuits 128. In a 3D configuration, the memory array can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more array of memory cells including a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for pass voltages in the memory device and information regarding which level of a pass voltage to apply during a specific program loop.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
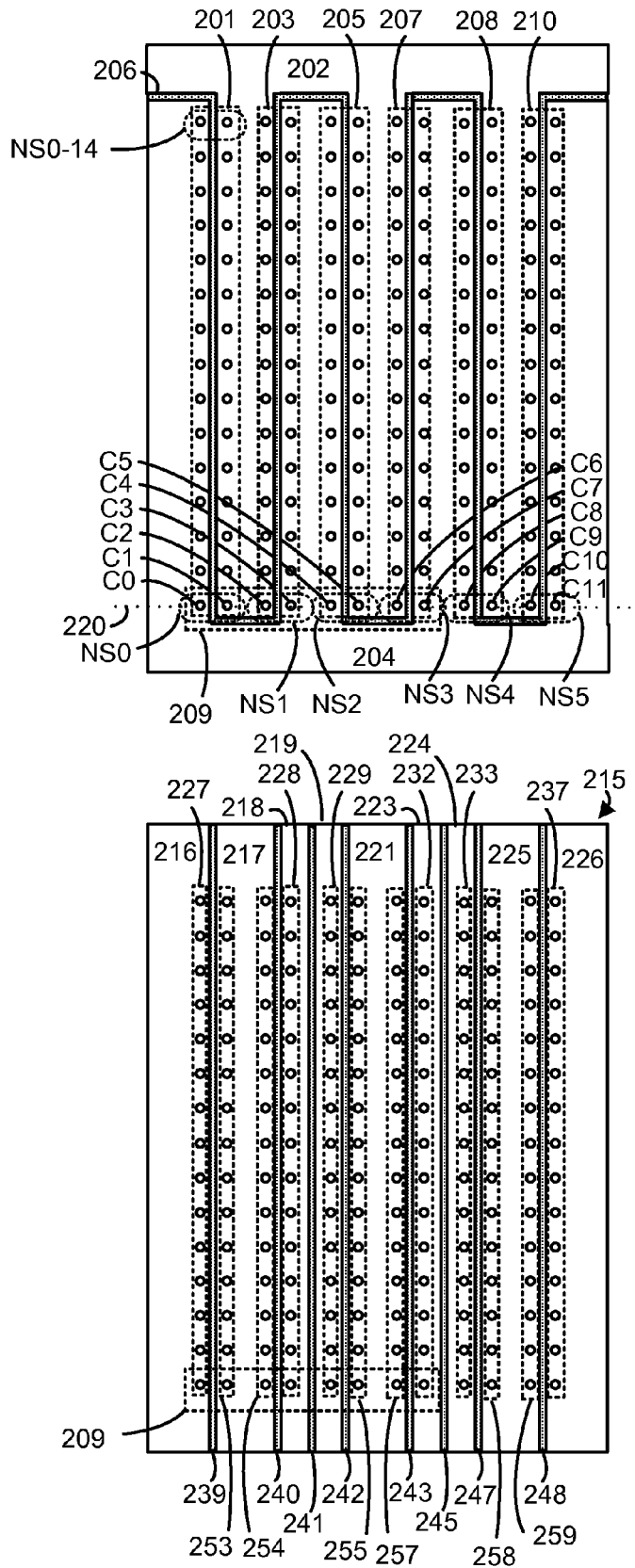
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 2C:
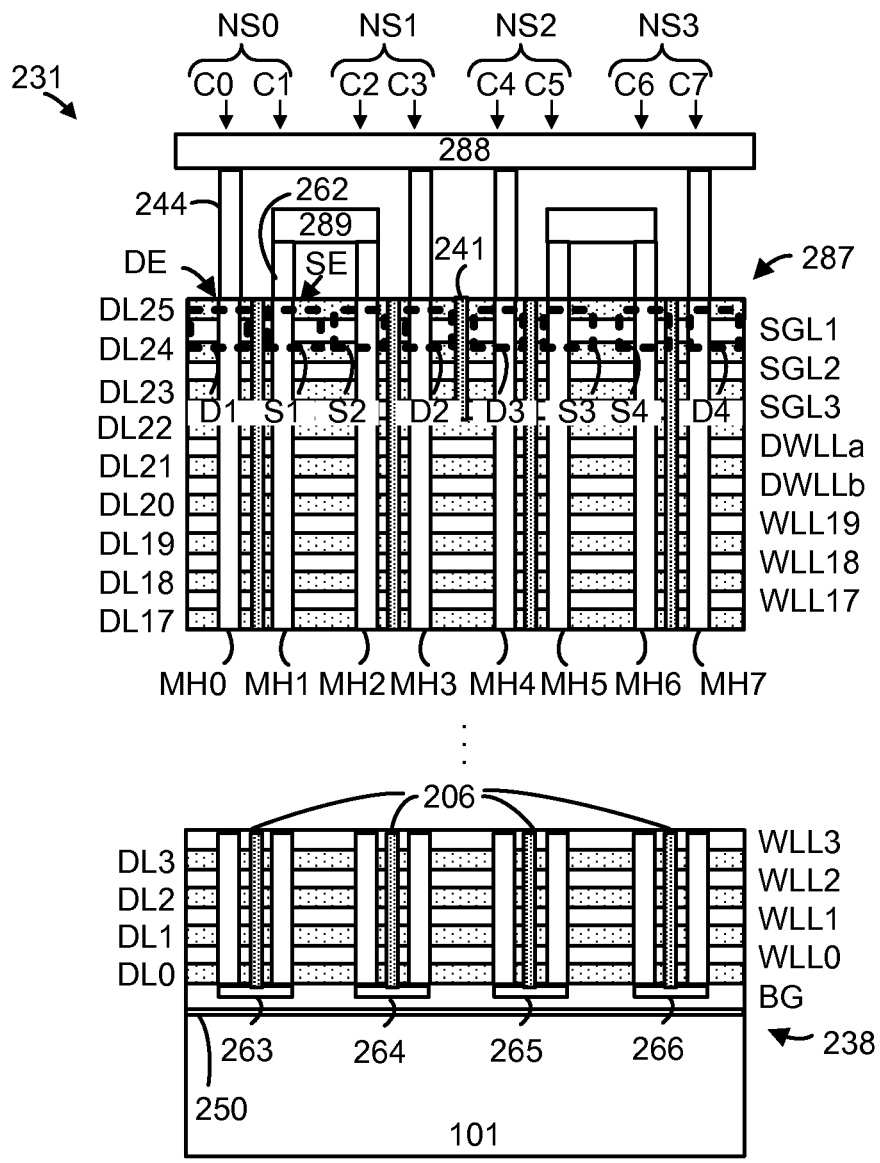
FIG. 2C depicts an embodiment of a stack 231 showing a cross-sectional view of the portion 209 of FIG. 2A, along line 220.

The view is of a representative layer among the multiple WLLs in a stack. Referring also to FIG. 2C, the stack includes alternating dielectric and conductive layers. The dielectric layers include DL0 to DL25 and may be made of $SiO_2$, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32,000 memory columns in the x direction, for a total of 384,000 memory columns in a block. With U-shaped NAND strings, 192,000 NAND strings are provided in this example. With straight NAND strings, 384,000 NAND strings are provided in this example. Assuming there are twenty-four memory cells per column, there are 384,000×24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220. This example includes three select gate layers, SGL1, SGL2 and SGL3. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors, in SGL1.

Figure 3A:
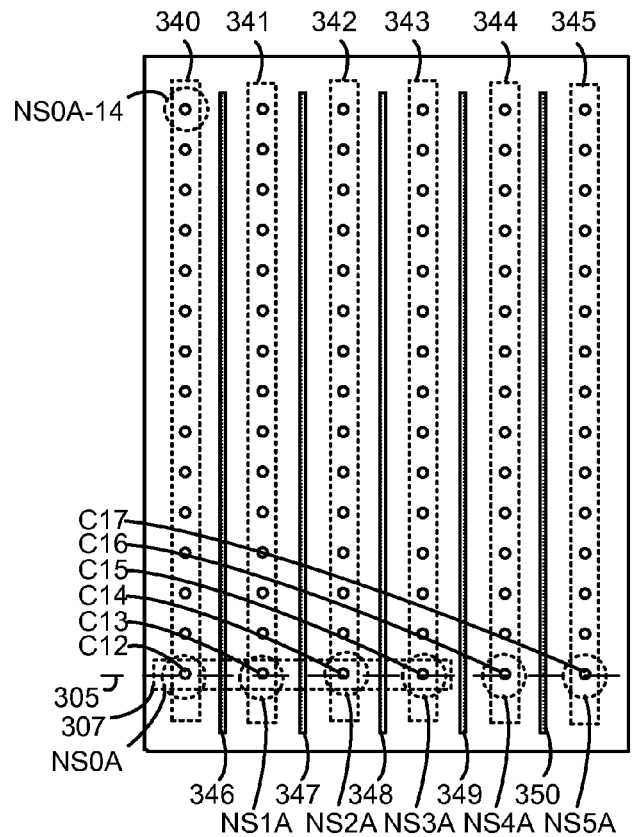
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C.

Regions 340, 341, 342, 343, 344 and 345 represent the memory cells (as circles) of respective sets of NAND strings. For example, region 340 represents memory cells in NAND strings NS0A, NS0A-14. Additional NAND strings include NS1A, NS2A, NS3A, NS4A and NS5A.

Alternatively, the layer 304 represents an SGS layer, in which case each circle represents an SGS transistor.

Figure 3B:
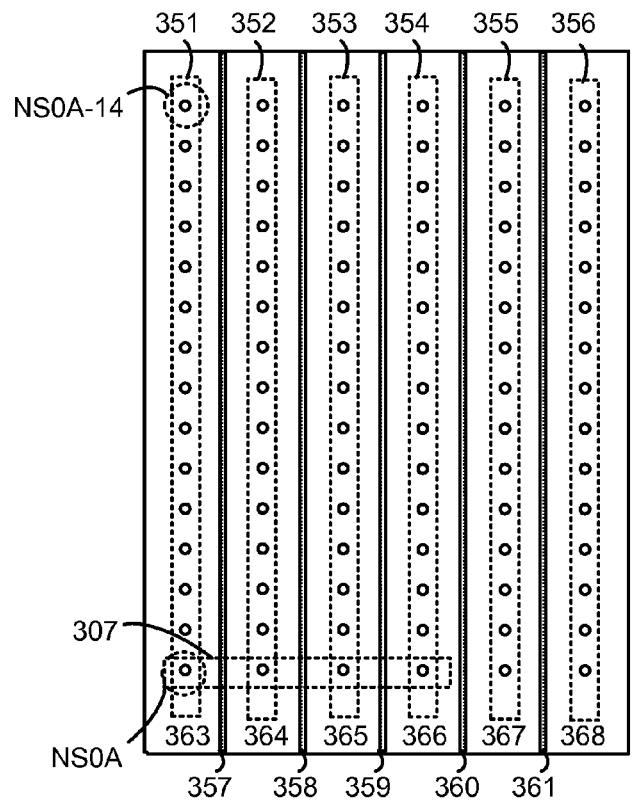
FIG. 3B depicts a top view of an example SGD layer 362, consistent with FIG. 3A.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C depicts an embodiment of a stack 376 showing a cross-sectional view of the portion 307 of FIG. 3A, along line 305. In this example, three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors SGS1a, SGS1b, SGS1c and SGS1d are formed in the SGS1 layer.

A region 246 of the stack is shown in greater detail in FIG. 4A.

Regions SGD1a, SGD1b, SGD1c and SGD1d represent SGD transistors.

FIG. 4A depicts a view of the region 246 of FIG. 3C, showing memory cells MC1 to MC5. A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TNL) 404, a polysilicon body or channel (CH) 405, and a dielectric core (DC) 406. A word line layer includes a block oxide (BOX) 402, a block high-k material 401, a barrier metal 400, and a conductive metal such as W 399 as a control gate. For example, control gates CG0, CG1, CG2, CG3 and CG4 are provided for the memory cells MC0, MC1, MC2, MC3 and MC4, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge. During an erase operation, the electrons return to the channel.

Each of the memory holes can be filled with a plurality of annular layers comprising a block oxide layer, a charge-trapping layer, a tunneling layer and a channel layer. A core region of each of the memory holes is filled with a body material, and the plurality of annular layers are between the core region and the WLLs in each of the memory holes.

As mentioned, parasitic cells can be formed between the memory cells during programming of the memory cells. For example, a parasitic cell PC0_1 is formed between MC0 and MC1, a parasitic cell PC1_2 is formed between MC1 and MC2, a parasitic cell PC2_3 is formed between MC2 and MC3, and a parasitic cell PC3_4 is formed between MC3 and MC4.

FIG. 4B depicts a cross-section view of the region 246 of FIG. 4A along line 444. Each layer is ring-shaped in one possible approach, except the core filler, which is a cylinder.

Figures 4C, 4D:
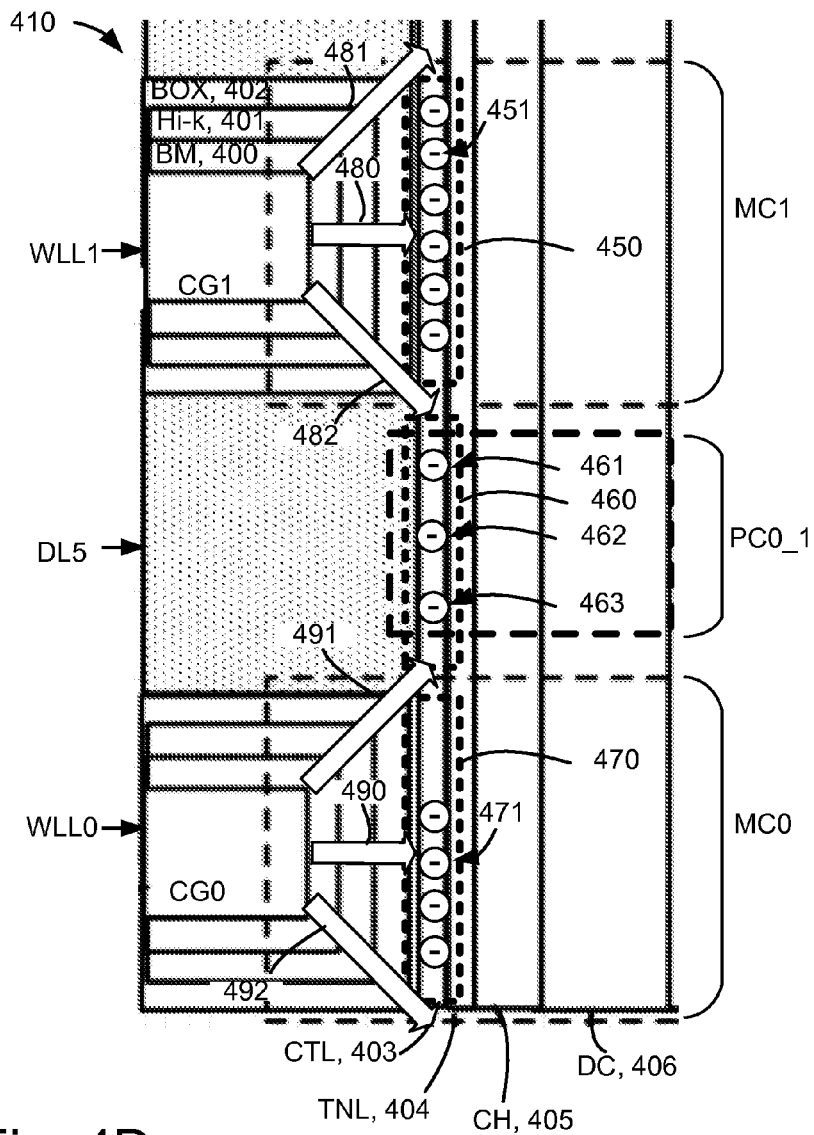
FIG. 4C depicts an expanded view of a portion 410 of the NAND string of FIG. 4A, showing the formation of a parasitic cell PC0_1 between the memory cells MC0 and MC1.
FIG. 4D depicts a table showing a magnitude of an electric field (Efield) which is seen by the parasitic cell PC0_1 of FIG. 4C with various combinations of pass voltages and data states on MC0 and MC1.

FIG. 4C depicts an expanded view of a portion 410 of the NAND string of FIG. 4A, showing the formation of a parasitic cell PC0_1 between the memory cells MC0 and MC1. When a voltage is applied to the control gate of a memory cell via a respective word lines an electric field is generated. For MC0, the electric field includes a component 490 which causes electrons 471 to tunnel into a region 470 of the charge-trapping layer 403, from the channel 405. Additionally, fringing fields 492 and 491 are created. These are components of the electric field that are directed to a region of the charge-trapping layer which is not directly adjacent to the control gate. For example, the fringing field 491 causes an electrons 463 to tunnel into a region 460 of the charge-trapping layer 403, from the channel 405, thereby forming PCO_1. Similarly, for MC1, the electric field includes a component 480 which causes electrons 451 to tunnel into a region 450 of the charge-trapping layer 403, from the channel 405. A fringing field 482 causes electrons 461 and 462 to tunnel into the region 460. An additional fringing field 481 causes a parasitic cell to be formed above MC1.

When a memory cell on a selected word line is subsequently read back, control gate read voltages such as VreadA, VreadB and VreadC (FIG. 8A) are applied to the memory cell while sensing circuitry determine whether the memory cell is in a conductive state. At the same time, a read pass voltage, Vread (e.g., 8-9 V), is applied to the remaining word lines. Since the control gate read voltage is typically significantly less than the read pass voltage, the parasitic cells adjacent to the selected word line will not be fully conductive during the read operation. This results in the memory cell appearing to have an upshifted Vth. The other parasitic cells, which are not adjacent to the selected word line, will be conductive since they are between word lines which both receive Vread.

FIG. 4D depicts a table showing a magnitude of an electric field (Efield) which is seen by the parasitic cell PC0_1 of FIG. 4C with various combinations of pass voltages and data states on MC0 and MC1. Assume that the word line programming order proceeds from the source-side word line, WLL0, to the drain side word line WLL22, one word line at a time. In this case, MC0 is programmed before MC1. MC0 is on a source side of MC1, and WLL0 is on a source side of WLL1. MC1 is on a drain side of MC0, and WLL1 is on a drain side of WLL0.

The example uses verify voltages of VvA=1, 2 and 3 V for the A, B and C states, respectively. Also, a final Vpgm of 21, 22 and 23 V is used for the A, B and C states, respectively, on average. For a given data state, some cells will program faster and have a lower final Vpgm and some cells will program slower and have a higher final Vpgm. PC0_1 is subject to an electric field a first time based on the Vpgm on MC1 and the Vpass on MC1, and a second time based on the Vpgm on MC1 and the Vpass on MC0.

During a programming operation, a sequence occurs in which the A, B and C state memory cells pass their respective verify test at a first, second or third phase of the programming operation. See also FIG. 10A to 10E. As a result, the pass voltage on the later-programmed word line can be set as a function of the phase of the programming operation. In particular, the pass voltage can be set at a maximum level, intermediate level or minimum level in the first, second or third phases, respectively. This approach can be modified such as to include multiple intermediate levels.

The table identifies the various combinations which are possible in an asymmetric word line bias technique. In the first three rows of the table, when PC0_1 is subject to an electric field a first time and the final Vpgm for MC0 is 21 V, Vpass on MC1 is set to 9 V so that the total electric field (Efield) is 30 V. Subsequently, three options are possible when PC0_1 is subject to an electric field a second time. If MC1 is programmed to the A, B or C state, the total Efield will be 28, 29 or 30 V, respectively. In each case, a lower pass voltage of 7 V is used for MC0 so that the total Efield is less than or equal to, but not higher than, the total Efield when PC0_1 is subject to an electric field the first time. As a result, due to the use of a lower Vpass on the previously-programmed cell (MC0) when programming a currently selected cell (MC1), the parasitic cell (PC0_1) between the previously-programmed cell and the currently selected cell is not further programmed. This advantageously means the Vth of MC0 does not change when MC0 is read back.

Each memory cell experiences this benefit in turn as it is programmed in the word line order.

In the next three rows of the table, when PC0_1 is subject to an electric field a first time and the final Vpgm for MC0 is 22 V, Vpass on MC1 is set to 8 V so that the total electric field (Efield) is again 30 V. If MC1 is programmed to the A, B or C state, the total Efield will be 28, 29 or 30 V, respectively. In each case, a lower pass voltage of 7 V is used for MC0 so that the total Efield is less than or equal to, but not higher than, the Efield when PC0_1 is subject to an electric field the first time.

In the last three rows of the table, when PC0_1 is subject to an electric field a first time and the final Vpgm for MC0 is 23 V, Vpass on MC1 is set to 7 V so that the total electric field (Efield) is again 30 V. If MC1 is programmed to the A, B or C state, the total Efield will be 28, 29 or 30 V, respectively. In each case, a lower pass voltage of 7 V is used for MC0 so that the total Efield is less than or equal to, but not higher than, the Efield when PC0_1 is subject to an electric field the first time.

Note that when programming occurs for a word line which is not adjacent to PC0_1, PC0_1 will be subject to an electric field which is based on pass voltages on the adjacent word lines. This electric field will be lower than any electric field it experiences when PC0_1 is adjacent to a currently programmed word line since a pass voltage is lower than any final program voltage.

As the memory device accumulates program-erase cycles, the programming speed of the memory cells may increases so that the final Vpgm becomes lower. However, this is expected to occur uniformly for the different data states so that the same pass voltages as used in a fresh memory device will continue to produce the same result of avoiding or minimizing the programming of parasitic cells.

FIG. 5A depicts a cross-sectional view in a word line direction of memory cells comprising a flat control gate and charge-trapping regions a 2D example of memory cells in the memory structure 126 of FIG. 1B. This is one alternative to a 3D memory device in which the pass voltages can be optimized during programming to reduce program disturb. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel oxide (TOx) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, . . . , 533 and 534, and an SGD transistor 535. The memory cell 500 includes the control gate 502 and an IPD portion 528 above the charge-trapping layer 504, the polysilicon layer 505 and the tunnel oxide layer 509. The memory cell 532 includes a control gate 536 and an IPD portion 537 above the charge-trapping layer 504, the polysilicon layer 505 and the tunnel oxide layer 509.

The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge-trapping or charge storing layer. The charge-trap layer can be a mix of silicon nitride and oxide, for instance. A difference between a floating gate memory cell and the flat memory cell is the height of the charge storage layer. A typically floating gate height may be about 100 nm, while a charge-trap layer can be as small as 3 nm, and the polysilicon layer can be about 5 nm.

The SGD and SGS transistors have the same configuration as the storage elements but with a longer channel length to ensure that current is cutoff in an inhibited NAND string.

FIG. 5C depicts an expanded view of a portion 540 of the NAND string of FIG. 5B, showing the formation of a parasitic cell PC1. The charge-trapping layer 504 includes regions 541 and 543 which are directly under and adjacent to the memory cells 500 and 532, respectively, and a region PC1 which forms a parasitic cell due to a fringing electric field 544 and 545 from the memory cells 500 and 532, respectively.

Figure 6A:
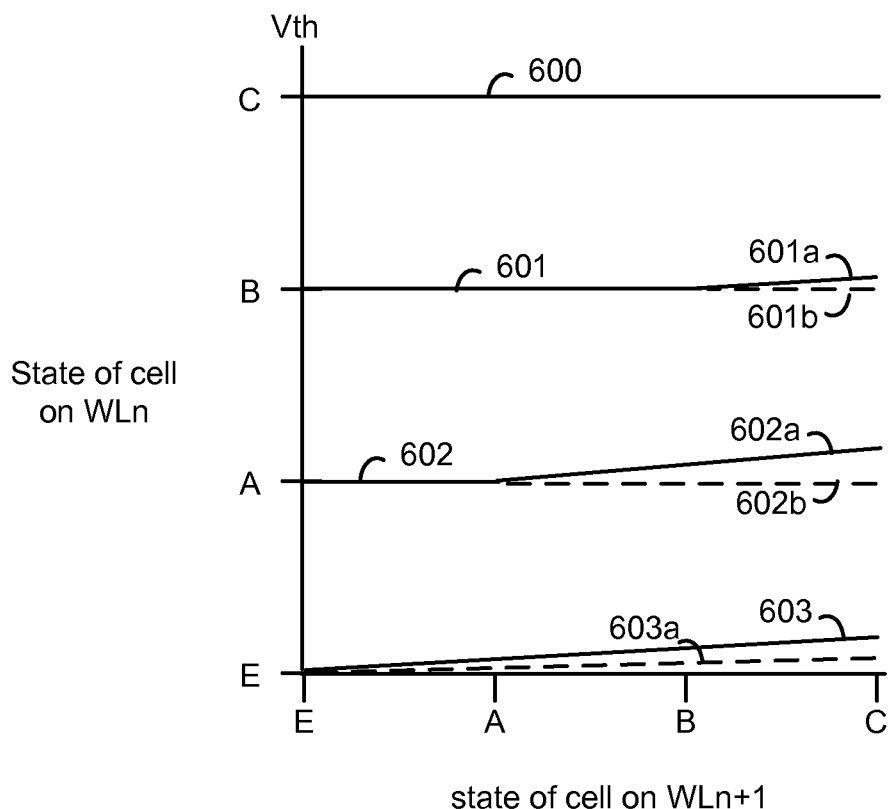
FIG. 6A depicts a plot showing an increase in the Vth of a memory cell on a selected word line WLn due to program disturb, as a function of a data state of a memory cell on a later-programmed word line, WLn+1.

FIG. 6A depicts a plot showing an increase in the Vth of a memory cell on a selected word line WLn due to program disturb, as a function of a data state of a memory cell on a later-programmed word line, WLn+1. The solid lines represent symmetric boosting in which an equal pass voltage is used on the word lines which are adjacent to a word line which is being programmed throughout he programming operation. The dashed lines represent asymmetric boosting in which modified pass voltages are used on the word lines which are adjacent to a word line which is being programmed, such as described in connection with FIG. 4D. The modified pass voltages are set based on the observation that a parasitic cell is initially programmed based on a first combination of a pass voltage and a final Vpgm, and that further programming can be avoided by ensuring that a second combination of pass voltage and a final Vpgm does not provide a higher electric field than the first combination.

For the case of symmetric boosting, after the memory cell on WLn is programmed to a data state, the memory cell experiences an increase in its Vth after the memory cell on WLn+1 is programmed to a higher data state. This applies for memory devices with large and small spaces between word lines and regardless of the existence of parasitic cells.

Referring to plot 603, with symmetric boosting, a memory cell on WLn which remains in the erased (E) state experiences an increase in Vth when the memory cell on WLn+1 is programmed to the A, B or C state (but not when the memory cell on WLn+1 remains in the E state).

Referring to plot 602 and 602a, with symmetric boosting, a memory cell on WLn which is programmed to the A state experiences an increase in Vth when the memory cell on WLn+1 is programmed to the B or C state (but not when the memory cell on WLn+1 is programmed to the A state or remains in the erased (E) state).

Referring to plot 601 and 601a, with symmetric boosting, a memory cell on WLn which is programmed to the B state experiences an increase in Vth when the memory cell on WLn+1 is programmed to the C state (but not when the memory cell on WLn+1 is programmed to the A state or remains in the erased (E) state).

The slope of the increase in the Vth of the memory cell on WLn is higher when the spacing between word lines is smaller.

Referring to plot 600, with symmetric or asymmetric boosting, a memory cell on WLn which is programmed to the C state does not experience an increase in Vth when the memory cell on WLn+1 is programmed, since the memory cell on WLn+1 cannot be programmed to a higher state, since the C state is the highest state in this example.

For the case of asymmetric boosting, after the memory cell on WLn is programmed to a data state, the memory cell does not experience an increase in its Vth even after the memory cell on WLn+1 is programmed to a higher data state. This is depicted by the plots 602b and 601b for the A and B states, respectively, of the memory cell on WLn. Referring to plot 603a, a memory cell in the E state on WLn will experience a reduced amount of upshift in Vth with asymmetric boosting compared to symmetric boosting. As mentioned, a cell in the E state is not programmed so that it cannot compensate for the increase in Vth in adjacent parasitic cells on either side of the E state cell. However, the increase in the Vth of the parasitic cell between WLn and WLn+1 can be decreased by the use of asymmetric boosting as described herein.

Figure 6B:
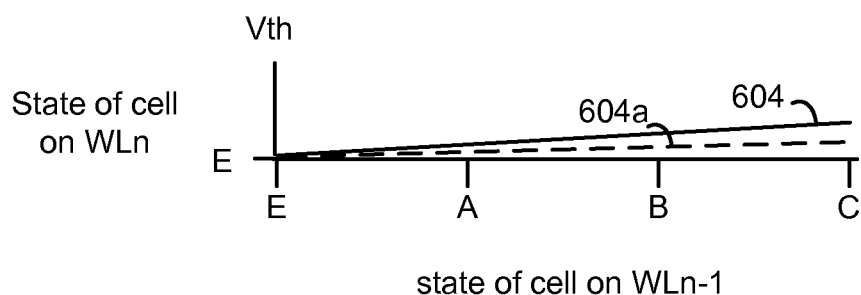
FIG. 6B depicts a plot showing an increase in the Vth of an erased state memory cell on a selected word line WLn as a function of a data state of a memory cell on a previously-programmed word line, WLn−1.

FIG. 6B depicts a plot showing an increase in the Vth of an erased state memory cell on a selected word line WLn as a function of a data state of a memory cell on a previously-programmed word line, WLn−1. The plot 604 with a solid line shows the case of symmetric boosting and the plot 604a with the dashed line shows the case of asymmetric boosting. A parasitic cell affects the Vth of an erased state cell on WLn similarly regardless of whether the parasitic cell is between WLn and WLn+1, or between WLn and WLn−1. The total upshift of the erased state cell is equal to the sum of plots 603 and 604 with symmetric boosting, or the sum of plots 603a and 604a with asymmetric boosting.

Figure 7:
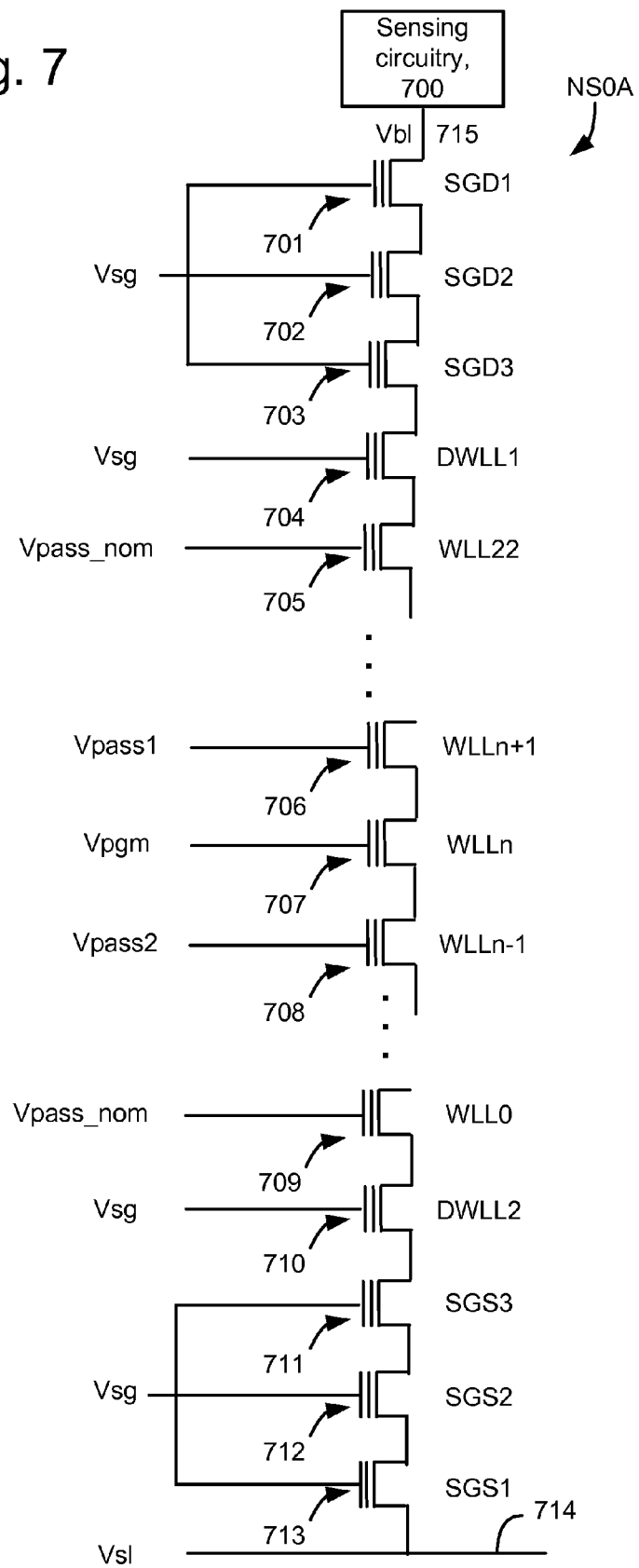
FIG. 7 depicts a circuit diagram of a NAND string consistent with the memory devices of FIGS. 2C, 3C and 5B.

FIG. 7 depicts a circuit diagram of a NAND string consistent with the memory devices of FIGS. 2C, 3C and 5B. An example NAND string NS0A includes SGD transistors 701, 702 and 703, a drain-side dummy memory cell 704, data-storing memory cells 705, . . . , 706, 707, 708, . . . , 709, a source-side dummy memory cell 710, and SGS transistors 711, 712 and 713. A bit line 715 connects the drain end of the NAND string to sensing circuitry 700, which is used to sense the NAND string during operations involving the select gate transistors and the memory cells. A source line 714 is connected to a source end of the NAND string. Voltage drivers can be used to provide the voltages depicted. For example, Vsg is applied to the control gates of the SGD transistors, which are connected to one another and to the control gates of the SGS transistors, which are connected to one another. Vsg can also be applied to the dummy memory cells 704 and 710. Vbl is the bit line voltage and Vsl is the source line voltage.

A similar circuit diagram can be provided for the NAND string 530 of FIG. 5B by omitting the extra select gate transistors and the dummy memory cells.

In this example, the memory cell 707 is selected for programming and is connected to a selected word line WLLn which receives Vpgm. The memory cell 708 is an adjacent, previously-programmed memory cell which is connected to a word line WLLn−1 which receives Vpass2. The memory cell 706 is an adjacent, later-programmed memory cell which is connected to a word line WLLn+1 which receives Vpass1. The remaining word lines, which are not adjacent to WLLn, including WLL0 to WLLn−2 and WLLn+2 to WLL22, can receive a nominal pass voltage, Vpass_nom, which can be optimized separately from Vpass1 and Vpass2.

Figure 8A:
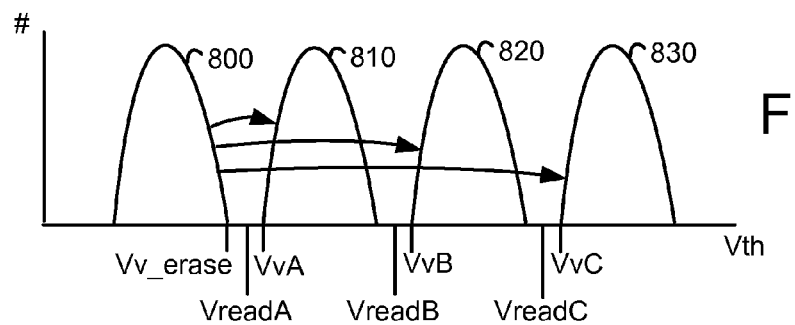
FIG. 8A depicts threshold voltage distributions during programming of memory cells, in an example embodiment in which there is an erased state and three programmed states.

FIG. 8A depicts threshold voltage distributions during programming of memory cells, in an example embodiment in which there is an erased state and three programmed states. The horizontal axis depicts Vth and the vertical axis depicts a number of memory cells. The memory cells initially have an erased state Vth distribution 800 which is associated with a verify voltage of Vv_erase, and are subsequently programmed to the A, B or C target data state as represented by Vth distributions 810, 820 and 830, respectively, using verify voltages of VvA, VvB and VvC, respectively. Read levels of VreadA, VreadB and VreadC are also depicted. A voltage Vread can be applied to all unselected word line during a read operation, including a verify operation during a programming operation as well as a read back of data after a programming operation is completed. This figure represents an ideal situation without program disturb.

Figure 8B:
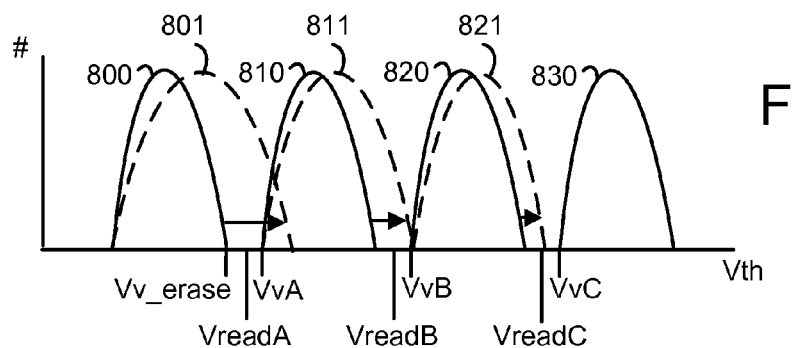
FIG. 8B depicts widening of the threshold voltage distributions of FIG. 8A due to program disturb, in a symmetric boosting case in which the pass voltage on WLn+1 (Vpass1) equals the pass voltage on WLn−1 (Vpass2) during a programming operation.

FIG. 8B depicts widening of the threshold voltage distributions of FIG. 8A due to program disturb, in a symmetric boosting case in which the pass voltage on WLn+1 (Vpass1) equals the pass voltage on WLn−1 (Vpass2) during a programming operation. Program disturb typically increases the upper tail of a Vth distribution. The Vth distributions 800, 810 and 820 as shown by solid lines transition to the distributions 801, 811 and 821, respectively, as shown by dashed lines. The C state generally does not experience program disturb.

Figure 8C:
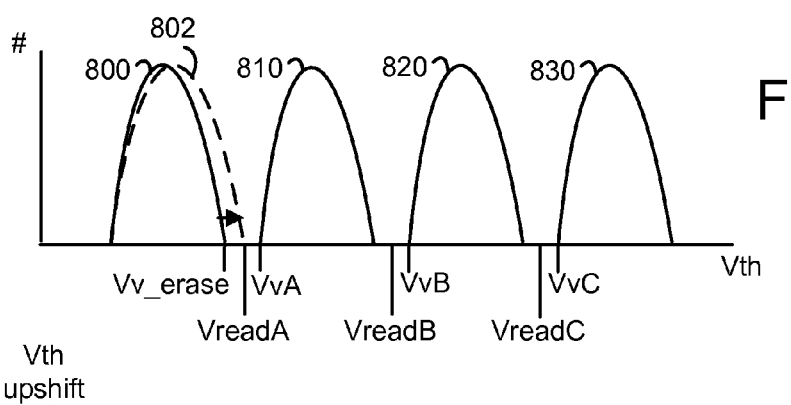
FIG. 8C depicts a reduction in the widening of the threshold voltage distributions of FIG. 8A due to program disturb, in an asymmetric boosting case in which the pass voltage on WLn+1 (Vpass1) initially exceeds the pass voltage on WLn−1 (Vpass2) and subsequently decreases during a programming operation.

FIG. 8C depicts a reduction in the widening of the threshold voltage distributions of FIG. 8A due to program disturb, in an asymmetric boosting case in which the pass voltage on WLn+1 (Vpass1) initially exceeds the pass voltage on WLn−1 (Vpass2) and subsequently decreases during a programming operation. See FIG. 10B to 10E. The Vth distribution 802 is wider than the Vth distribution 800 but by a smaller amount than an amount by which the Vth distribution 801 is wider than the Vth distribution 800 in FIG. 8B. The Vth distributions for the programmed states are advantageously not widened.

Figure 8D:
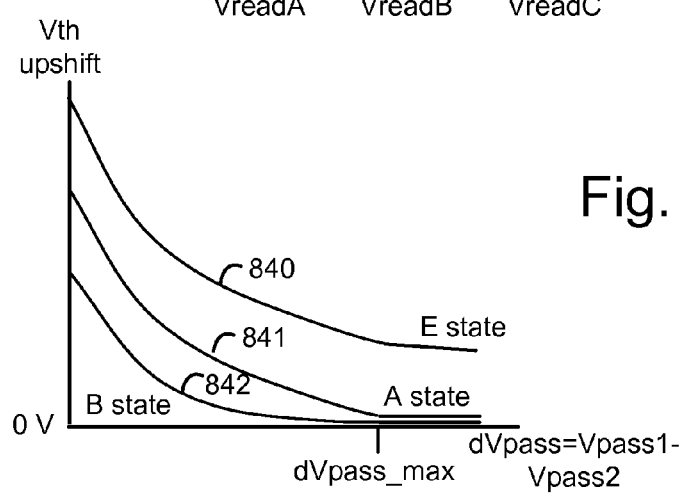
FIG. 8D depicts a plot showing a reduction in the Vth upshift for different programmed data states on WLn as a function of dVpass=Vpass1−Vpass2.

FIG. 8D depicts a plot showing a reduction in the Vth upshift for different programmed data states on WLn as a function of dVpass=Vpass1−Vpass2. The horizontal axis depicts dVpass and the vertical axis depicts an upshift or widening of a Vth distribution of a set of memory cells on WLn after programming of a set of memory cells on WLn+1. Plot 840 indicates that the Vth upshift for an E state cell decreases as Vpass increases and levels off at a non-zero value. Plots 841 and 842 indicate that the Vth upshift for an A or B state cell, respectively, decreases to zero as dVpass increases to an optimum value of dVpass_max, consistent with FIG. 8C. dVpass_max may be about 2-4 V, for example.

FIG. 9 depicts an example programming operation for memory cells which minimizes program disturb by optimizing pass voltages. Step 900 begins a programming operation for a set of memory cells connected to a set of word lines. Step 901 selects a word line (WLn) for programming. Step 902 initializes Vpgm. Step 903 sets Vpass1 on WLn+1 and Vpass2 on WLn−1. This step can be based on various criterion. For example, step 903a determines a current program loop number. Vpass1 can be relatively higher when the current program loop number is relatively lower. Vpass1 can be initially fixed at a maximum level and subsequently made progressively smaller during a programming operation. Vpass1 can begin to become progressively smaller when the current program loop number exceeds a threshold count. See FIG. 10A to 10E. This approach can be implemented by storing a table of program loop number cross-referenced to Vpass1 and, optionally, Vpass2, so that a pass voltage for each program loop is predetermined.

Step 903b determines a current data state being verified. Vpass1 can be relatively higher when the current data state being verified is relatively lower. This approach can be implemented by storing a table of data state cross-referenced to Vpass1 and, optionally, Vpass2. This approach is adaptive since the specified program loops which are used to verify a given data state can vary based on factors such as programming speed. For example, Vpass1 can be initially fixed at a maximum level when the A state cells are being verified and subsequently made progressively smaller when the B state cells are being verified.

Step 903c comprises monitoring a programming progress of the memory cells on WLn. For example, a reduction in Vpass1 can be triggered when on all, or a specified majority, of the A state cells pass their verify test. A further reduction in Vpass1 can be triggered based on all, or a specified majority, of the B state cells passing their verify test. See FIG. 10B. Or, further multiple reductions in Vpass1 can be triggered based on different portions (e.g., 25%, 50%, 75%) of the B and/or C state cells passing their verify tests. See FIGS. 10C and 10D. This approach can be implemented by storing a table of threshold counts of memory cells which pass a verify test cross-referenced to Vpass1 and, optionally, Vpass2. In each program-verify iteration, a count can be obtained of a number of cells which pass the verify test for one or more data states which are subject to a verify test. A decision to adjust Vpass1 (or Vpass2) can be made based on whether the count exceeds the threshold counts.

Step 904 concurrently applies Vpgm to the selected word line (WLn), Vpass1 to the adjacent later-programmed word line (WLn+1), Vpass2 to the adjacent previously-programmed word line (WLn−1) and Vpass_nom to the remaining word lines. Step 905 determines one or more current data states to verify and performs the corresponding verify test or tests. For example, in FIG. 10A, the A state cells are verified at program loops 1-4, the B state cells are verified at program loops 4-7 and the C state cells are verified at program loops 7-10.

Decision step 906 determines if the verify test or tests are passed for the current data state or states. For example, a verify test for a data state may be passed when all, or a significant majority, e.g., 90-95%, of the memory cells which are to be programmed to that data state have passed the verify test. A memory cell passes a verify test when a verify voltage is applied to its control gate via a word line and the memory cell is determined by sensing circuitry to be in a non-conductive state. In this case, the Vth of the memory cell exceeds the verify voltage. If decision step 906 is false, a next program loop (program-verify iteration) is performed. In this case, Vpgm is incremented at step 910 and step 903 is repeated. If decision step 906 is true, decision step 907 determines whether programming has been completed for the word line. If decision step 907 is false, a next program loop is performed and Vpgm is incremented at step 910. If decision step 907 is true, a decision step 908 determines whether there is another word line to program. If decision step 908 is false, the programming operation ends at step 909. If decision step 908 is true, a new word line is selected to be programmed at step 901.

Figure 10A:
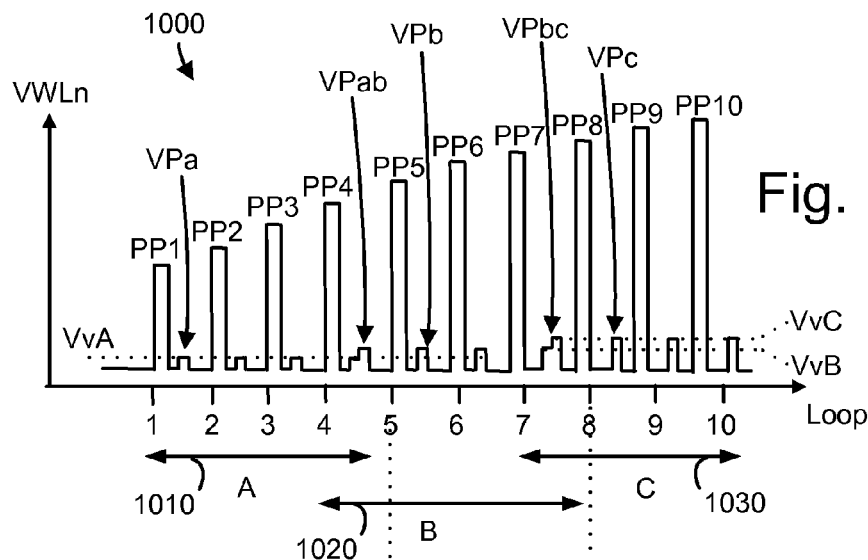
FIG. 10A depicts a plurality of program-verify iterations consistent with the programming operation of FIG. 9.

FIG. 10A depicts a plurality of program-verify iterations consistent with the programming operation of FIG. 9. The horizontal axis depicts program loop number, and the vertical axis depicts control gate or word line voltage on WLn, the selected word line. Generally, a programming operation includes successive program-verify iterations. Each program-verify iteration has a program portion in which a program voltage is applied to the control gates of the memory cells via a selected word line, followed by a verify portion in which one or more verify voltages are applied to the control gates of the memory cells while at least some of the memory cells are sensed.

The voltage waveform 1000 depicts a series of program voltages or program pulses PP1 to PP10 and verify voltages. One or two verify voltages are provided after each program voltage, as an example, based on the programming phase and the corresponding target data states which are being verified. 0 V may be applied to the selected word line between the program and verify voltages. For example, during a first set of program loops 1010 (program loops 1-4), e.g., one or more initial program-verify iterations, the A state cells are subject to a verify test using VvA as indicated by an example verify pulse VPa. During a second set of program loops 1020 (program loops 4-7), e.g., one or more intermediate program-verify iterations, the B state cells are subject to a verify test using VvB as indicated by an example verify pulse VPb. During a third set of program loops 1030 (program loops 7-10), e.g., one or more final program-verify iterations, the C state cells are subject to a verify test using VvC as indicated by an example verify pulse VPc. Loop 10 represents the final program-verify iteration. The program voltages are stepped up in each program loop after the first loop. This is an example of incremental step pulse programming (ISPP).

Further, the verifying of the A and B states overlaps in program loop 4, where the A and B state cells are subject to a verify test using VvA and VvB, respectively, as indicated by an example waveform VPab. The verifying of the B and C states overlaps in program loop 7, where the B and C state cells are subject to a verify test using VvB and VvC, respectively, as indicated by an example waveform VPbc.

The one or more intermediate program-verify iterations and the one or more final program-verify iterations are part of subsequent program-verify iterations which are after the one or more initial program-verify iterations.

In one approach, the data states are verified in predetermined program loops (e.g., the A state, A and B states, B state, B and C states and C state are verified in program loops 1-3, 4, 5-6, 7 and 8-10, respectively). In another approach, the verification of cells of a data state begins at a predetermined program loop but the verification continues until a program loop in which all, or nearly all, of the memory cell cells of that data state have passed the respective verify test (e.g., verification for the A state, B state and C state begins in program loops 1, 4 and 7, respectively). In another approach, the verification of cells of a data state begins based on the programming progress of cells of a lower data state. For example, the verification of cells of the B state may begin when a specified portion (e.g., 80%) of the memory cells of the A state have passed their respective verify test (e.g., 80% of the A state cells pass a verify test in program loop 3 so that verification of the B state begins in program loop 4). Other approaches are possible as well.

Generally, a majority of the memory cells of a given data state will pass their verify test in a small range of program loops, while the slower cells of the given data state will pass their verify test at a later program loop and the faster cells of the given data state will pass their verify test at an earlier program loop. For example, a majority of the A state cells will pass their verify test at program loops 2 and 3, while the slower A state cells will pass their verify test at program loop 4 and the faster A state cells will pass their verify test at program loop 1.

The above techniques can be extended to cases where there are additional data states, e.g., eight or sixteen data states. For example, with eight data states A-G, several phases are possible in a programming operation. For instance, five phases may be used which include these groups of states which are verified concurrently: ABC, BCD, CDE, DEF and EFG. Another example is: ABCD, CDEF and EFG. Many other examples are possible.

Figure 10B:
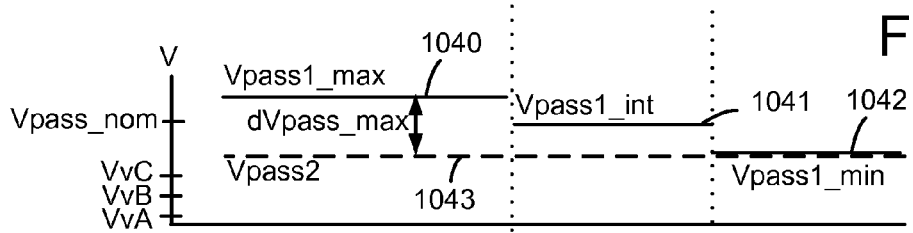
FIG. 10B depicts one example of pass voltages consistent with FIG. 10A in which a decreasing level of Vpass1 is used on WLn+1 and a fixed level of Vpass2 is used on WLn−1.

FIG. 10B depicts one example of pass voltages consistent with FIG. 10A in which a decreasing level of Vpass1 is used on WLn+1 and a fixed level of Vpass2 is used on WLn−1. The horizontal axes of FIG. 10B to 10E represent loop number and are aligned with the horizontal axis of FIG. 10A. The vertical axis depicts a pass voltage level, and shows the verify voltages VvA, VvB and VvC and the nominal pass voltage of Vpass_nom. Vpass_nom can be equal to Vpass1_max, in one approach but, generally can be optimized independently of Vpass1 and Vpass2.

Vpass1 is initially at a maximum level, Vpass1_max (line 1040), during the initial program-verify iterations, while the A state cells are being verified. Vpass1 then steps down to an intermediate level, Vpass1_int (line 1041), during the one or more intermediate program-verify iterations, while the B state cells are being verified. Vpass1 can step down at this time because the programming of all or most of the A state cells has been completed such that the associated NAND string, including the parasitic cells, are inhibited from further programming while remaining B and C state cells on the selected word line continue to be programmed. The difference between Vpass1_int and Vpass2 is sufficient to avoid program disturb of B state cells.

Vpass1 then steps down to a final, minimum level, Vpass1_min (line 1042), during the one or more final program-verify iterations, while the C state cells are being verified. Vpass1 can step down to a minimum at this time because the programming of all or most of the B state cells has been completed. Vpass1_min can be the same as, or slightly higher than, Vpass2, for instance, since the C state cells are generally resistant to Vth widening. Vpass1 can be kept at the fixed minimum during a plurality of final program-verify iterations of the plurality of program-verify iterations (program loops 1-10). Vpass1 can be kept at the fixed minimum during at least two of the program voltages.

Vpass2 may be held at a fixed level (line 1043) which is equal to, or close to, Vpass_min. This approach is desirable because Vpass1 is provided at the minimum level while Vpgm reaches its highest levels. The total electric field, which is proportional to Vpass1+Vpgm, is therefore smaller than if Vpass1 was kept at Vpass1_max. As a result, the programming of the parasitic cells adjacent to the E state cells especially is reduced.

In this example, the subsequent program-verify iterations (program loops 5-10) comprise program-verify iterations (loops 5-7) in which the first pass voltage is fixed at a first reduced level (Vpass1_int) followed by program-verify iterations (loops 8-10) in which the first pass voltage is fixed at a second reduced level (Vpass1_min), below the first reduced level.

In one approach, the first pass voltage and the difference (dVpass) start to become progressively smaller when a determination is made that a specified portion of memory cells which are to be programmed to a lowest target data state (e.g., 90-95% of the A state cells) of the plurality of target data states have passed a verify test. For example, 95% or more of the A state cells may pass their verify test in program loop 4 so that Vpass1 becomes smaller in program loop 5.

In another approach, the first pass voltage and the difference start to become progressively smaller after a predetermined number of program-verify iterations (e.g., four) of the plurality of program-verify iterations have been performed.

Figure 10C:
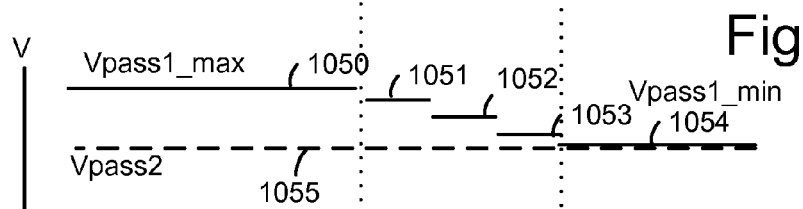
FIG. 10C depicts another example of pass voltages consistent with FIG. 10A in which a decreasing level of Vpass1 is used on WLn+1 and a fixed level of Vpass2 is used on WLn−1.

FIG. 10C depicts another example of pass voltages consistent with FIG. 10A in which a decreasing level of Vpass1 is used on WLn+1 and a fixed level of Vpass2 is used on WLn−1. Vpass1 is initially at Vpass1_max (line 1050), during the initial program-verify iterations, while the A state cells are being verified. Vpass1 then steps down to multiple intermediate levels (line 1051, 1052 and 1053, during the one or more intermediate program-verify iterations, while the B state cells are being verified. In this example, Vpass steps down with each program verify iteration of the intermediate program-verify iterations. Vpass1 then steps down to Vpass1_min (line 1054) during the one or more final program-verify iterations, while the C state cells are being verified, and is fixed at that minimum level during the program-verify iterations. Vpass2 (line 1055) may be held at a fixed level which is equal to Vpass_min. This approach lowers Vpass1 sooner than in the programming operation than in FIG. 10B so that the magnitude of the fringing field is reduced sooner.

Figure 10D:
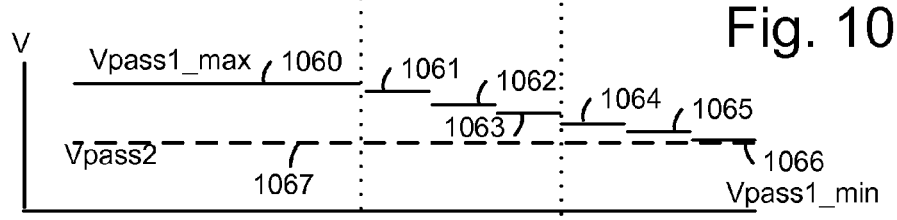
FIG. 10D depicts a further example of pass voltages consistent with FIG. 10A in which a decreasing level of Vpass1 is used on WLn+1 and a fixed level of Vpass2 is used on WLn−1.

FIG. 10D depicts a further example of pass voltages consistent with FIG. 10A in which a decreasing level of Vpass1 is used on WLn+1 and a fixed level of Vpass2 is used on WLn−1. Vpass1 is initially at Vpass1_max (line 1060), during the initial program-verify iterations, while the A state cells are being verified. Vpass1 then steps down to multiple intermediate levels (line 1061, 1062 and 1063, during the one or more intermediate program-verify iterations, while the B state cells are being verified. In this example, Vpass steps down with each program verify iteration of the intermediate program-verify iterations. Vpass1 then steps down to Vpass1_min in additional steps (lines 1064, 1065 and 1066) during the one or more final program-verify iterations, while the C state cells are being verified. In this example, Vpass steps down with each program verify iteration of the intermediate final program-verify iterations. The step down of Vpass can be configured so that Vpass reaches Vpass1_min during an expected final program-verify iteration (e.g., the tenth program loop). Vpass2 may be held at a fixed level which is equal to Vpass_min. Vpass2 is at a fixed level (lined 1067).

Figure 10E:
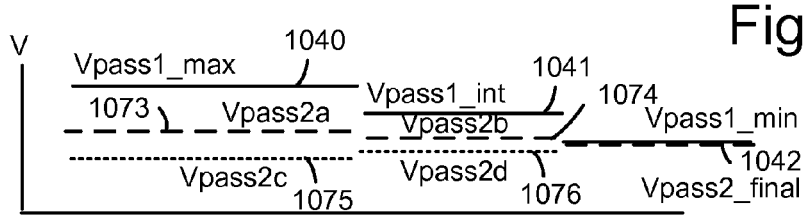
FIG. 10E depicts a further example of pass voltages consistent with FIG. 10A in which a decreasing level of Vpass1 is used on WLn+1 and an increasing or decreasing level of Vpass2 is used on WLn−1.

FIG. 10E depicts a further example of pass voltages consistent with FIG. 10A in which a decreasing level of Vpass1 is used on WLn+1 and an increasing or decreasing level of Vpass2 is used on WLn−1. In some cases, it may be desired to increase or decrease Vpass2 during a programming operation. Lines 1040, 1041 and 1042 for Vpass1 are repeated from FIG. 10B. Lines 1073, 1074 and 1042 represent Vpass2*a*, Vpass2*b* and Vpass2_final, respectively, in an example where Vpass2 decreases during the programming operation. Lines 1075, 1076 and 1042 represent Vpass2*c*, Vpass2*d* and Vpass2_final, respectively, in an example where Vpass2 decreases during the programming operation.

Generally, the initial value of Vpass1, e.g., Vpass1_max, should exceed the final value of Vpass2, e.g., Vpass2_final by a specified amount. This applies when Vpass2 is fixed, increasing or decreasing. This specified amount should be the difference (Diff1) in the verify levels of the highest and lowest programmed data states, e.g., VvA-VvC. This difference is known since the verify levels are configured in the control of the memory device. Typically, Diff1 is the same as the difference (Diff2) between the final Vpgm levels of the highest and lowest programmed data states. Diff2 can be determined by testing of the memory device. However, it is possible that Diff1 and Diff2 are different, in which case the initial value of Vpass1 should exceed the final value of Vpass2 by and Diff2 since the parasitic cells are a function of the program voltages.

Accordingly, it can be seen that, in one embodiment, a method for programming in a memory device comprises: programming selected memory cells connected to a selected word line (WLn) of a set of word lines, the selected memory cells are programmed to a plurality of target data states, and memory cells which are to remain in an erased state are also connected to the selected word line, the programming is performed by performing a plurality of program-verify iterations for the selected word line, each program-verify iteration of the plurality of program-verify iterations is performed by applying a program voltage followed by performing a verify test for one or more target data states of the plurality of target data states, and the program voltage is stepped up in the plurality of program-verify iterations; and during each program voltage, applying a first pass voltage to a word line (WLn+1) in the set of word lines which is adjacent to the selected word line and after the selected word line in a word line programming order, while applying a second pass voltage to a word line (WLn−1) in the set of word lines which is adjacent to the selected word line and before the selected word line in a word line programming order, wherein during one or more initial program-verify iterations of the plurality of program-verify iterations, the first pass voltage exceeds the second pass voltage by a difference, the first pass voltage becomes progressively smaller during subsequent program-verify iterations of the plurality of program-verify iterations, and the difference becomes progressively smaller during the subsequent program-verify iterations.

In another embodiment, a memory device comprises a set of NAND strings, each NAND string comprising memory cells and a charge-trapping layer which extends continuously in the NAND string, a set of word lines connected to the set of NAND strings, and a control circuit. The control circuit, to program selected memory cells connected to a selected word line (WLn) of the set of word lines, is configured to perform a plurality of program-verify iterations for the selected word line, each program-verify iteration of the plurality of program-verify iterations comprises a program voltage followed by one or more verify tests for one or more target data states of a plurality of target data states, the program voltage is stepped up in the plurality of program-verify iterations, and during each program voltage, the control circuit is configured to apply a first pass voltage to a word line (WLn+1) in the set of word lines which is adjacent to the selected word line and after the selected word line in a word line programming order, and apply a second pass voltage to a word line (WLn−1) in the set of word lines which is adjacent to the selected word line and before the selected word line in a word line programming order, wherein during one or more initial program-verify iterations of the plurality of program-verify iterations, the first pass voltage exceeds the second pass voltage by a difference, and the first pass voltage becomes progressively smaller during subsequent program-verify iterations of the plurality of program-verify iterations.

In another embodiment, a method for programming in a memory device, comprises: performing initial program-verify iterations of a plurality of program-verify iterations for memory cells connected to a selected word line, wherein memory cells which are to be programmed to a lowest target data state of a plurality of target data states pass a verify test during the initial program-verify iterations, a first pass voltage is applied to a word line (WLn+1) which is adjacent to the selected word line and after the selected word line in a word line programming order, while a second pass voltage is applied to a word line (WLn−1) which is adjacent to the selected word line and before the selected word line in a word line programming order, the first pass voltage exceeds the second pass voltage by a difference in the one or more initial program-verify iterations; monitoring a programming progress of the memory cells which are to be programmed to the lowest target data state during the initial program-verify iterations; and based on the monitoring, performing subsequent program-verify iterations of the plurality of program-verify iterations, the subsequent program-verify iterations comprise intermediate program-verify iterations in which the first pass voltage becomes progressively smaller.

In another embodiment, a memory device comprises: a set of NAND strings, each NAND string comprising memory cells and a charge-trapping layer which extends continuously in the NAND string; a set of word lines connected to the set of NAND strings; and a control circuit. The control circuit, to program selected memory cells connected to a selected word line (WLn) of the set of word lines, is configured to apply program voltages to the selected word line using incremental step pulse programming, and during each program voltage, the control circuit is configured to apply a first pass voltage to a word line (WLn+1) in the set of word lines which is adjacent to the selected word line and after the selected word line in a word line programming order, and apply a second pass voltage to a word line (WLn−1) in the set of word lines which is adjacent to the selected word line and before the selected word line in a word line programming order, wherein during the incremental step pulse programming, the first pass voltage initially exceeds the second pass voltage by a difference, and subsequently becomes progressively smaller.

In another embodiment, a memory device comprises a NAND string comprising memory cells and a charge-trapping layer which extends continuously in the NAND string; a set of word lines connected to the NAND string; and a control circuit. The control circuit, to program a selected memory cell connected to a selected word line (WLn) of the set of word lines, applies program voltages to the selected word line using incremental step pulse programming, and during each program voltage, applies a first pass voltage to a word line (WLn+1) in the set of word lines which is adjacent to the selected word line and on a drain side of the selected word line, and applies a second pass voltage to a word line (WLn−1) in the set of word lines which is adjacent to the selected word line and on a source side of the selected word line, wherein during the incremental step pulse programming, the first pass voltage initially exceeds the second pass voltage by a difference, and subsequently becomes progressively smaller.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming in a memory device, comprising:
   programming selected memory cells connected to a selected word line of a set of word lines, the selected memory cells are programmed to a plurality of target data states, and memory cells which are to remain in an erased state are also connected to the selected word line, the programming is performed by performing a plurality of program-verify iterations for the selected word line, each program-verify iteration of the plurality of program-verify iterations is performed by applying a program voltage followed by performing a verify test for one or more target data states of the plurality of target data states, and the program voltage is stepped up in the plurality of program-verify iterations; and
   during each program voltage, applying a first pass voltage to a word line in the set of word lines which is adjacent to the selected word line and after the selected word line in a word line programming order, while applying a second pass voltage to a word line in the set of word lines which is adjacent to the selected word line and before the selected word line in a word line programming order, wherein during one or more initial program-verify iterations of the plurality of program-verify iterations, the first pass voltage exceeds the second pass voltage by a difference, the first pass voltage becomes progressively smaller during subsequent program-verify iterations of the plurality of program-verify iterations, and the difference becomes progressively smaller during the subsequent program-verify iterations.

2. The method of claim 1, wherein:
   the difference by which the first pass voltage exceeds the second pass voltage is at least as high as a difference between a verify voltage of a highest target data state of the plurality of target data states and a verify voltage of a lowest target data state of the plurality of target data states.

3. The method of claim 1, wherein:
the subsequent program-verify iterations comprise program-verify iterations in which the first pass voltage is fixed at a first reduced level followed by program-verify iterations in which the first pass voltage is fixed at a second reduced level, below the first reduced level.

4. The method of claim 1, wherein:
the first pass voltage and the difference start to become progressively smaller when a determination is made that a specified portion of memory cells which are to be programmed to a lowest target data state of the plurality of target data states have passed a verify test.

5. The method of claim 1, wherein:
the first pass voltage and the difference start to become progressively smaller after a predetermined number of program-verify iterations of the plurality of program-verify iterations have been performed.

6. The method of claim 1, further comprising:
determining a programming progress of the selected memory cells, wherein the first pass voltage and the difference start to become progressively smaller based on the programming progress.

7. The method of claim 1, further comprising:
determining a programming progress of the selected memory cells; and
deciding when to keep the first pass voltage at a fixed minimum for a remainder of the plurality of program-verify iterations based on the programming progress, wherein the first pass voltage becomes progressively smaller until it reaches the fixed minimum.

8. The method of claim 1, wherein:
the first pass voltage and the difference are fixed during the one or more initial program-verify iterations.

9. The method of claim 1, wherein:
the first pass voltage is equal to the second pass voltage in a final program-verify iteration of the plurality of program-verify iterations.

10. The method of claim 1, wherein:
the second pass voltage becomes progressively smaller during the subsequent program-verify iterations of the plurality of program-verify iterations.

11. The method of claim 1, wherein:
the second pass voltage becomes progressively larger during the subsequent program-verify iterations of the plurality of program-verify iterations.

12. The method of claim 1, wherein:
memory cells connected to the set of word lines are arranged in NAND strings; and
each NAND string comprises a charge-trapping layer which extends continuously in the NAND string.

13. A memory device, comprising: selected memory cells connected to a selected word line of a set of word lines; and a control circuit, the control circuit:
is configured to program the selected memory cells to a plurality of target data states, wherein memory cells which are to remain in an erased state are also connected to the selected word line;
to perform the programming, is configured to perform a plurality of program- verify iterations for the selected word line;
to perform each program-verify iteration of the plurality of program-verify iterations, is configured to apply a program voltage followed by performing a verify test for one or more target data states of the plurality of target data states, wherein the program voltage is stepped up in the plurality of program-verify iterations; and
during each program voltage, is configured to apply a first pass voltage to a word line in the set of word lines which is adjacent to the selected word line and after the selected word line in a word line programming order, while applying a second pass voltage to a word line in the set of word lines which is adjacent to the selected word line and before the selected word line in a word line programming order, wherein during one or more initial program-verify iterations of the plurality of program-verify iterations, the first pass voltage exceeds the second pass voltage by a difference, the first pass voltage becomes progressively smaller during subsequent program-verify iterations of the plurality of program-verify iterations, and the difference becomes progressively smaller during the subsequent program-verify iterations.

* * * * *